(12) United States Patent
Macki

(10) Patent No.: US 12,700,844 B2
(45) Date of Patent: Aug. 4, 2026

(54) SELF-TUNING TRANSMITTER COMBINER COMPRISING A PLURALITY OF FILTERS COMBINING WITH A REACTIVE ELEMENT AT A JUNCTION AND INCLUDING A CONTROL UNIT FOR TUNING THE FILTERS AND REACTIVE ELEMENT

(71) Applicant: Norsat International Inc., Richmond (CA)

(72) Inventor: Michael Jerome Macki, Richmond Hill (CA)

(73) Assignee: Norsat International Inc., Richmond (CA)

( * ) Notice: Subject to any disclaimer, the term of this patent is extended or adjusted under 35 U.S.C. 154(b) by 363 days.

(21) Appl. No.: 18/078,994

(22) Filed: Dec. 11, 2022

(65) Prior Publication Data

US 2024/0195040 A1 Jun. 13, 2024

(51) Int. Cl.
H03H 7/48 (2006.01)
H01P 1/213 (2006.01)
H01P 5/18 (2006.01)

(52) U.S. Cl.
CPC ........... H03H 7/482 (2013.01); H01P 1/2138 (2013.01); H01P 5/18 (2013.01)

(58) Field of Classification Search
CPC ...................................................... H03H 7/482
USPC ........................................................ 333/17.1
See application file for complete search history.

(56) References Cited

U.S. PATENT DOCUMENTS 5,420,552 A * 5/1995 Sakka ................ H03H 11/1291
                                                            333/17.1
5,473,292 A * 12/1995 Victorin ................... H03H 7/46
                                                            333/17.1

* cited by examiner

*Primary Examiner* — Benny T Lee
(74) *Attorney, Agent, or Firm* — Nexus Law Group LLP; Nicholas Toth; Otto Zsigmond

(57) ABSTRACT

A self-tuning, resonant cavity transmitter combiner joins multiple RF transmitters and combines their signals onto a single transmission line. An additional tuning element is added to the junction of the signal paths to overcome the bandwidth limitations of the transmission lines joining the signal paths. An algorithm was developed to optimize the RF performance of the combiner by sampling the RF signals at various points in the RF circuit.

18 Claims, 7 Drawing Sheets

SELF-TUNING TRANSMITTER COMBINER COMPRISING A PLURALITY OF FILTERS COMBINING WITH A REACTIVE ELEMENT AT A JUNCTION AND INCLUDING A CONTROL UNIT FOR TUNING THE FILTERS AND REACTIVE ELEMENT

BACKGROUND OF THE INVENTION

1. Field of Invention

This invention pertains to RF signal conditioning products that combine the signals from multiple RF transmitters onto a single transmission line.

2. Description of Related Art

A transmitter combiner allows multiple transmitters to share a single antenna or signal path. The resonant cavity in each signal path is tuned to the frequency of a corresponding transmitter. Self tuning combiners sample the signals from the transmitters and tune the cavities to resonate at respective frequencies without input from the user. The outputs of each resonant cavity are joined to a common junction using transmission lines. The length of these transmission lines depends on the frequencies of the transmitters. This limits the operating frequency range of the combiner as deviation from the original frequency for which the transmission line was optimized can create excess loss of RF power within the combiner and sub-optimal performance.

An object of the invention is to address the above shortcomings.

SUMMARY OF THE INVENTION

The above shortcomings may be addressed by providing, in accordance with one aspect of the invention, a self-tuning transmitter combiner. The combiner includes: (a) a junction for combining a plurality of signals transmitted along a plurality of signal paths comprising a plurality of filters, respectively, the junction comprising a reactive element; and (b) a computer-implemented control unit operable to tune the plurality of filters in accordance with a plurality of carrier frequencies of the plurality of signals, respectively, the control unit being further operable to tune the reactive element such that a lowest insertion gain selected by the control unit from a plurality of insertion gains respectively associated with the plurality of signal paths is maximized.

The control unit may be operable to minimize a plurality of reflected powers of the plurality of filters by adjusting a plurality of cavity positions associated with the plurality of filters, respectively. The control unit may be operable to determine, in response to a respective one carrier frequency, a corresponding one cavity position by interpolation among a plurality of known cavity positions respectively associated with a plurality of known carrier frequencies. Interpolation is a known method of constructing new data points based on the range of a discrete set of known data points. The control unit may be operable to set the reactive element to a midpoint tuning position of a range of tuning positions of the reactive element. The control unit may be further operable to then determine a first lowest insertion gain. The control unit may be operable to determine a first plurality of insertion gains associated with the plurality of signal paths respectively extending from a plurality of directional couplers of the combiner, through the plurality of filters, through the junction, and then to an output directional coupler of the combiner. The control unit may be further operable to then select the first lowest insertion gain from the first plurality of insertion gains. The control unit may be operable to: (c) set the reactive element to a new tuning position, within the range of the tuning positions, that is offset by a predetermined amount from a preceding tuning position of the tuning positions; (d) determine a new plurality of the insertion gains in response to the new tuning position; (e) determine a new lowest insertion gain in response to the new plurality of the insertion gains; and (f) iteratively repeat steps (c) to (e) until the new lowest insertion gain is lower than a preceding lowest insertion gain.

In accordance with another aspect of the invention, there is provided a method of tuning a combiner. The method involves: (a) by a computer-implemented control unit, tuning a plurality of filters of a plurality of signal paths in accordance with a plurality of carrier frequencies of a plurality of signals being transmitted along the plurality of signal paths, respectively; and (b) by the computer-implemented control unit, tuning a reactive element of a junction for combining the plurality of signals, such that a lowest insertion gain selected from a plurality of insertion gains respectively associated with the plurality of signal paths is maximized.

Step (a) may be performed before performing step (b). The method may further involve repeating step (a) after having performed step (b). Step (a) may involve minimizing a plurality of reflected powers of the plurality of filters by adjusting a plurality of cavity positions of the plurality of filters, respectively. Adjusting the plurality of cavity positions associated with the plurality of filters, respectively, may involve determining, in response to a respective one carrier frequency, a corresponding one cavity position by interpolating among a plurality of known cavity positions respectively associated with a plurality of known carrier frequencies. The method may further involve repeating the step of respectively minimizing the plurality of reflected powers of the plurality of filters. Step (b) may involve setting the reactive element to a midpoint tuning position of a range of tuning positions of the reactive element and then determining a first lowest insertion gain. Determining the first lowest insertion gain may involve determining a first plurality of the insertion gains associated with the plurality of signal paths extending from a plurality of input directional couplers of the combiner, through the plurality of filters, respectively, through the junction, and then to an output directional coupler of the combiner. The method may further involve selecting the first lowest insertion gain from the first plurality of the insertion gains. The method may further involve setting the reactive element to a second tuning position, within the range of the tuning positions, that is offset by a predetermined amount from the midpoint tuning position. The method may then further involve determining a second plurality of the insertion gains associated with the plurality of signal paths. The method may then further involve selecting a second lowest insertion gain from the second plurality of the insertion gains. The method may further involve changing the polarity of the predetermined amount, if the second lowest insertion gain is lower than the first lowest insertion gain. The method may further involve: (c) setting the reactive element to a new tuning position, within the range of the tuning positions, that is offset by the predetermined amount from a preceding tuning position of the tuning positions; (d) determining a new plurality of the insertion gains in response to the new tuning position; (e) determining a new lowest insertion gain in response the new plurality of the insertion gains; and (f) iteratively repeating steps (c) to (e) until the new lowest insertion gain is lower than a preceding lowest insertion gain. The method may further involve receiving, by the computer-implemented control unit, user instructions indicating manual override and, in response to the user instructions, performing at least one computer-implemented action selected from: (g) adjusting a tuning element position of a user-selected filter of the plurality of filters; and (h) setting the reactive element to a user-selected tuning position within a range of tuning positions of the reactive element.

In accordance with another aspect of the invention, there is provided a self-tuning transmitter combiner. The combiner includes: (a) means for tuning a plurality of filters of a plurality of signal paths in accordance with a plurality of carrier frequencies of a plurality of signals being transmitted along the plurality of signal paths, respectively; and (b) means for tuning a reactive element of a junction for combining the plurality of signals, such that a lowest insertion gain selected from a plurality of insertion gains respectively associated with the plurality of signal paths is maximized.

The foregoing summary is illustrative only and is not intended to be in any way limiting. Other aspects and features of the present invention will become apparent to those of ordinary skill in the art upon review of the following description of embodiments of the invention in conjunction with the accompanying figures and claims.

BRIEF DESCRIPTION OF THE DRAWINGS

In drawings which illustrate by way of example only embodiments of the invention.

DETAILED DESCRIPTION OF THE INVENTION

The embodiments of the present invention are described in detail with reference to the attached drawings, wherein like features are denoted by the same reference labels throughout the detailed description of the drawings.

Figure 1:
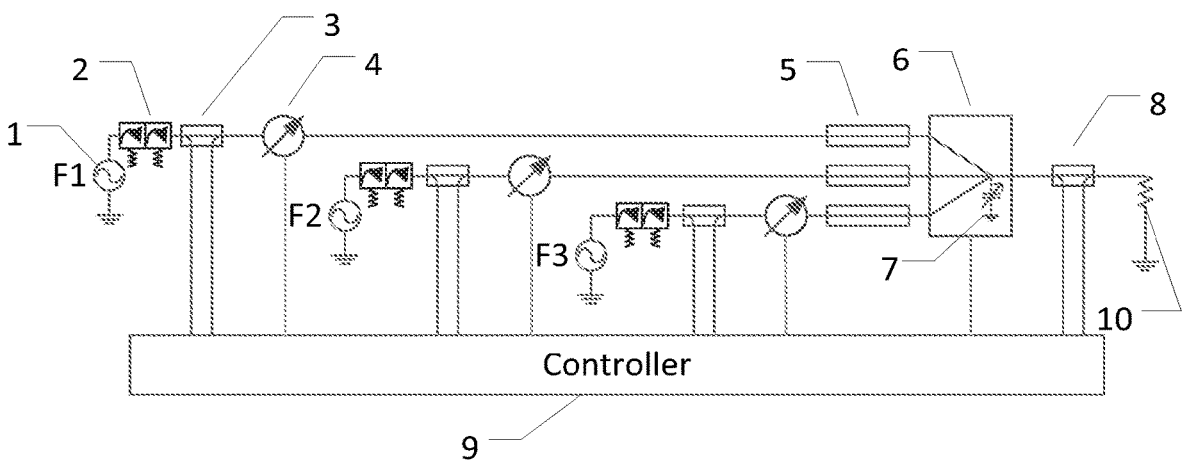
FIG. 1 is a schematic diagram of the self tuning resonant cavity transmitter combiner.

FIG. 1 is a schematic of the self tuning transmitter combiner. FIG. 1 illustrates how the components are connected in each signal path, how the components are joined together into a single output, and how each component is connected to a control unit such as the controller 9.

The embodiment shown in FIG. 1 comprises a number of signal paths equal to the number of channels that the combiner is required to support, a junction 6 (also referred to herein as a "junction block" 6) with a tunable reactive element 7 (also referred to herein as an "electro-mechanical tunable reactive element" 7 or "reactive element" 7), a final directional coupler 8 at the output of the combiner and the controller 9.

Three signal paths are shown for illustration, but embodiments of the invention can be adapted for many different numbers of paths. The Radio Frequency (RF) sources 1 represent the radios which are external to the invention and the load 10 represents any additional equipment connected to the output of the invention. FIG. 1 shows the three signal paths having three RF sources 1 that inject into the three signal paths three signals at carrier frequencies F1, F2, and F3, respectively.

Each signal path comprises an isolator 2, a directional coupler 3, an electro-mechanical tunable resonant cavity 4 (also referred to herein as a "tunable resonator" 4, "resonant cavity" 4, or "resonant cavity filter" 4) and a fixed electrical length transmission line 5. The purpose of isolator 2 is to prevent any RF power from flowing back into the radio 1. The directional coupler 3 sends a small sample of the RF power travelling in the forward direction (away from the radio) and in the reverse direction (towards the radio) to the controller 9. The tunable resonator 4, when adjusted to the correct frequency, filters out any extraneous signals that may have entered the signal path and maximizes the transmission of the desired signal. The fixed length transmission line 5, in conjunction with the tunable reactive element 7, acts as an impedance transformer. The impedance transformer minimizes the interference that the signal path can cause to the signals transmitted through the other paths.

The junction block 6 connects the individual signal paths to a single output. The electro-mechanical tunable reactive element 7 optimizes the transmission of all the signals.

The final directional coupler 8 sends a small sample of the combined signals from all the signal paths traveling in the forward and reverse directions, respectively, to the controller 9.

The controller 9 analyzes the signals from the directional couplers 3,8 and adjusts the tuning of the resonant cavities 4 using an electromechanical device. The controller 9 determines the frequency and power level for each signal based on the samples sent from the directional couplers 3 in each path. The controller 9 uses a data set that relates the tuning element position for each resonant cavity 4 to the corresponding resonance frequency and interpolates the tuning element position required to match the measured frequency for each channel. Each tuning element of the resonant cavity 4 is then set to the corresponding position. The controller 9 then makes fine adjustments to the resonant cavities 4 to minimize any power reflected from the resonant cavities 4.

If the combiner was operating at a fixed set of frequencies, then the electrical lengths of the transmission lines 5 could be predetermined to maximize the power transmission through the combiner. This combiner allows the operator to change frequencies within a specified range so the lengths of the transmission lines will not be optimal. The reactive element 7 is set to compensate for the sub-optimal length of the transmission lines.

Figure 2:
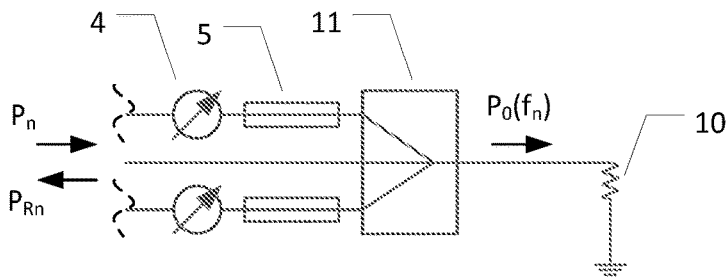
FIG. 2 illustrates how certain components affect the combiner performance in the absence of a compensating reactive element.
Figure 3:
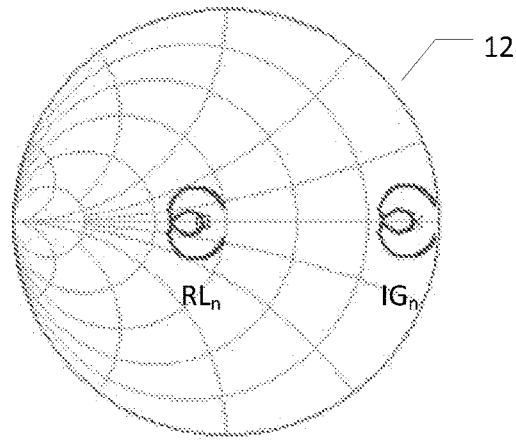
FIG. 3 illustrates the performance of the combiner when the frequencies match the lengths of the transmission lines.

FIGS. 1 to 5 illustrate the use of a tuned reactance of a reactive element 7 (FIG. 1) in bringing the performance of non-ideal length transmission lines 5 (FIGS. 1 and 2) in line with the performance of ideal transmission lines. With reference to FIG. 2, when the transmission lines 5 joining the resonant cavities 4 together are the ideal length for the channel frequencies, the effects of the different resonant cavities 4 on the reflections at the junction 11 and the transmission through the junction 11 are respectively shown in FIG. 3. Thus, the (admittance) Smith Chart 12 in FIG. 3 shows the performance of the transmission path under ideal conditions. However, if the resonant cavities 4 are tuned to different frequencies, then the transmission lines 5 add a reactance to the junction 11 (FIG. 2) as illustrated by the reflection curves on the Smith Chart 13 (FIG. 4) being displaced from the purely resistive line on the chart into the reactive area. This circumstance adds additional reflections and reduces the transmitted power through the junction 11. Adding a reactance by the reactive element 7 (FIG. 1) that has the opposite sign and a magnitude that counterbalances the reactance of the transmission lines 5 returns the reflected and transmitted power curves back to the resistive line of the Smith Chart 14 (FIG. 5) and reduces the internal reflections while optimizing the transmission through the junction 6 (FIG. 1).

Figure 4:
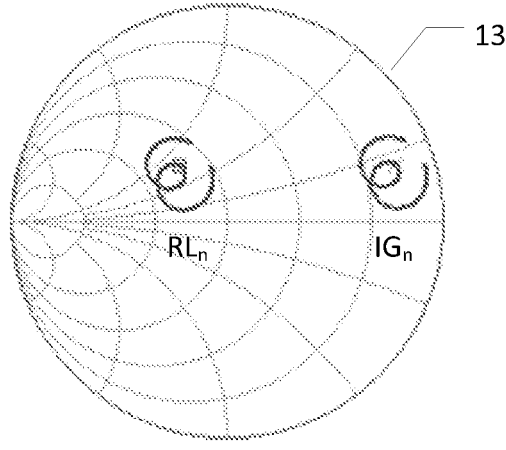
FIG. 4 illustrates how operating the combiner that is missing the compensating reactance at frequencies that do not match the transmission line lengths degrades the combiner's performance.
Figure 5:
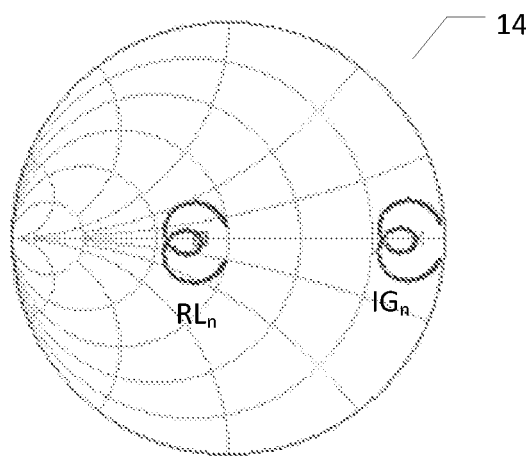
FIG. 5 illustrates how adding the reactive element can return the combiner's performance to closely match the ideal case.

The effect of the transmission lines can be understood from FIG. 2 with reference to FIGS. 3 and 4. The Smith Chart 12 (FIG. 3) shows the reflections from and the transmission through the junction 11 when the transmission lines are the ideal length for the combiner frequencies. The curves for the reflection from and transmission through the junction 11 are on the resistive line for the Smith Chart 12 which corresponds to minimal reflection and maximum transmission. With respect to FIG. 2, if the resonant cavities 4 in the combiner are tuned to a different frequency, then the transmission lines 5 are no longer optimal and add a reactance to the junction 11. This situation is illustrated in the FIG. 4 Smith Chart 13. The reflection and transmission curves have moved away from the resistive line and are now in the reactive region of the chart. Adding a reactance by the reactive element 7 (FIG. 1) that is the opposite sign and a magnitude that balances out the reactance of the transmission lines 5 returns the transmission and reflection curves to the resistive line (FIG. 5 Smith Chart 14). This minimizes the internal reflection and maximizes transmission. The method for determining this reactance of the reactive element 7 (FIG. 1) is described below.

The controller 9 (FIG. 1) first adjusts the tuning element for each resonant cavity 4 until the return loss for the corresponding resonant cavity 4 is minimized. The return loss is defined below:

$RL_n$—return loss for the signal passing through resonant cavity n.

$f_n$—carrier frequency for signal path n.

$P_n$—power in the forward direction for signal path n at $f_n$ as shown in FIG. 2.

$P_{Rn}$—power reflected from resonant cavity n as shown in FIG. 2.

$$RL_n = \frac{P_{Rn}}{P_n}$$

The controller 9 determines a quantity called the insertion gain for each signal path according to the following:

$IG_n$—insertion gain of signal path n.

$P_o(f_n)$—forward power at the output at frequency $f_n$ as shown in FIG. 2.

$$IG_n = \frac{P_o(f_n)}{P_n}$$

The controller 9 adjusts the reactive element 7 until the lowest value of $IG_n$ is maximized.

The controller 9 will then readjust the tuning of the resonant cavities 4 to minimize corresponding reflections and then do a final adjustment to the reactive element 7 to maximize the worst insertion gain. The tuning of one element in an RF circuit can affect the tuning of other elements in the circuit. The second tuning pass is done to compensate for this effect.

FIG. 3 shows the admittance Smith Chart that displays the return loss $RL_n$ and insertion gain $IG_n$ for signal path n when the frequencies transmitted through the combiner are well matched to the lengths of the transmission lines 5.

FIG. 4 shows the admittance Smith Chart that displays the return loss $RL_n$ and insertion gain $IG_n$ for signal path n when the frequencies transmitted through the combiner are not well matched to the lengths of the transmission lines 5.

FIG. 5 shows the admittance Smith Chart that displays the return loss $RL_n$ and insertion gain $IG_n$ for signal path n when a reactive element 7 (FIG. 1) is added to compensate for the discrepancy between the operating frequencies of the combiner and the lengths of the transmission lines 5.

Figure 6:
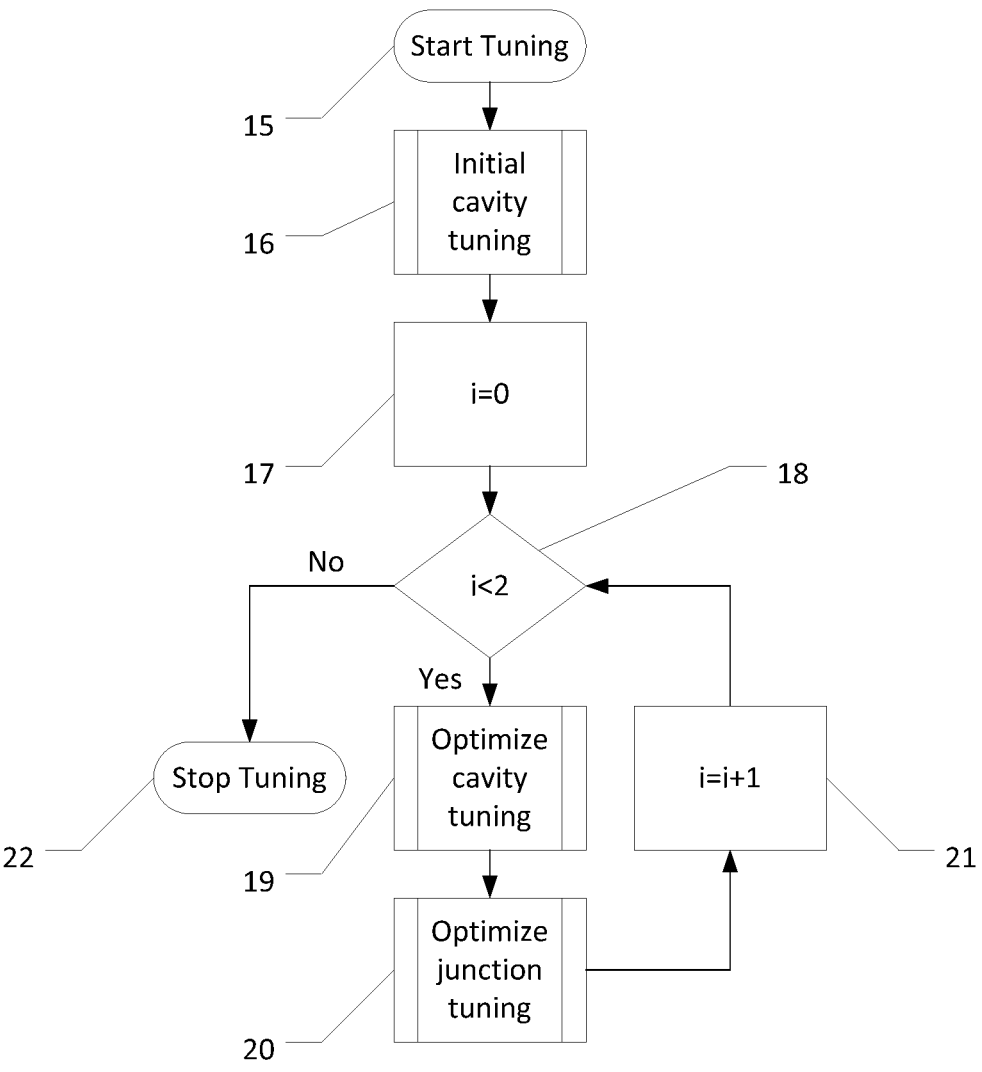
FIG. 6 is a flowchart illustrating the tuning algorithm used by the combiner.

FIG. 6 is a flowchart showing the tuning algorithm for the combiner shown in FIG. 1. The tuning algorithm starts tuning at step 15 when the combiner is first powered or when the controller 9 (FIG. 1) determines that the frequencies F1, F2, and/or F3 for one or more of the radios 1 have changed. The "initial cavity tuning" sub-process 16 is executed. The loop counter i is initialized to zero (i=0) at step 17. The "optimize cavity tuning" sub-process 19 is executed in response to the condition "Yes" that is determined by the controller 9 at step 18 when the loop counter i has a value that is less than 2 (i<2). Thereafter, the "optimize junction tuning" sub-process 20 is executed. At step 21, the loop counter i is incremented such that the value of the loop counter i becomes equal to i+1 (i=i+1). After the processes 19, 20 are executed for a first time since invoking step 15 to start tuning, the value of the loop counter i becomes 1 (one). At step 18, when the value of the loop counter i is equal to 1 (one), the controller 9 determines that the value of the loop counter i is less than 2 (i<2). These processes 19, 20 are repeated a second time as the adjustment of a tuning element of a resonant cavity 4 (FIG. 1) can affect the performance of a previously tuned element and this second pass compensates for this effect. The loop counter is incremented again at step 21. After the processes 19, 20 are repeated a second time, the execution of step 21 causes the value of the loop counter to become 2 (two). The escape condition determined at step 18 for the loop is met (loop condition "No") and the tuning algorithm stops tuning at step 22. Additional information for the tuning sub-processes is provided in FIGS. 7, 8 and 9.

Figure 7:
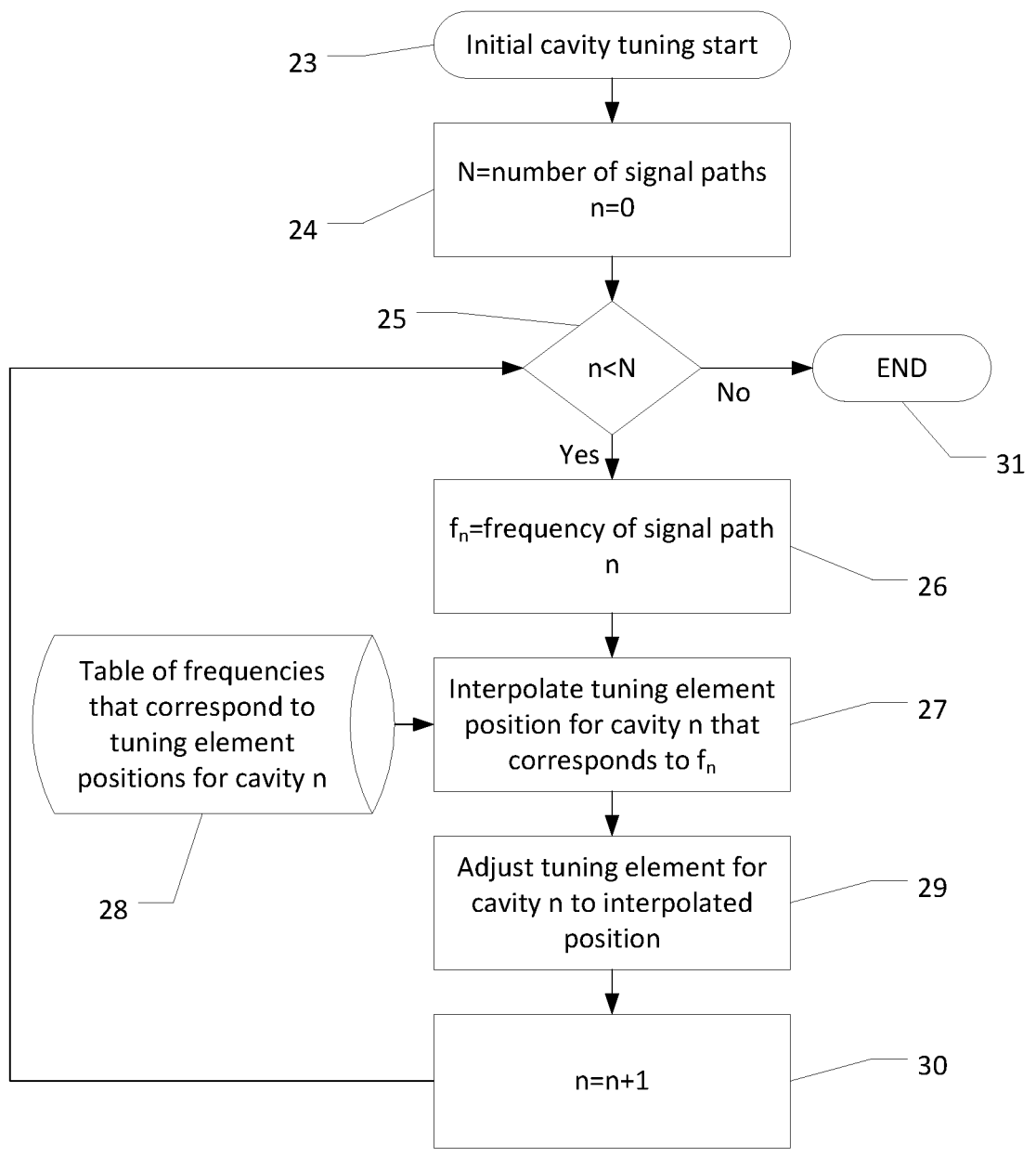
FIG. 7 is a flowchart of the "initial cavity tuning" sub-process.

FIG. 7 is a flowchart of the "initial cavity tuning" sub-process. This initial cavity tuning sub-process starts at step 23 when invoked by step 16 of the main tuning algorithm of FIG. 6. The number of signal paths is defined as N (N=number of signal paths), and the loop counter n is initialized to the value of zero (n=0) at step 24. For example, the embodiment shown in FIG. 1 has three signal paths such that N=3. Other examples may apply. At step 25, the value of the loop counter n is compared to the number of signal paths N. If the value of the loop counter n is less than the number of signal paths N (i.e. n<N), then the condition "Yes" is true and the process proceeds to step 26. First the carrier frequency $f_n$ ($f_1$ when n=1) of the signal sent down the first signal path is determined at step 26 (i.e. $f_n$=frequency of signal path n). There is a table 28 that lists the resonance frequency of each resonant cavity 4 that corresponds to the position of the tuning element of the resonant cavity 4. Interpolation is used at step 27 to determine the position of the tuning element for each resonant cavity 4 that corresponds to the carrier frequency $f_n$ for the corresponding signal path n. The tuning element for the resonant cavity 4 is adjusted to an interpolated position at step 29. The loop counter n is incremented at step 30 such that the value of the loop counter n becomes equal to n+1 (i.e. n=n+1). Steps 26, 27, 28, 29 are repeated for each signal path in turn until the resonant cavity 4 in the last path is tuned. At this point execution of step 25 results in the determination that the loop escape condition is met (loop condition "No") and the initial cavity tuning sub-process ends at step 31.

Figure 8:
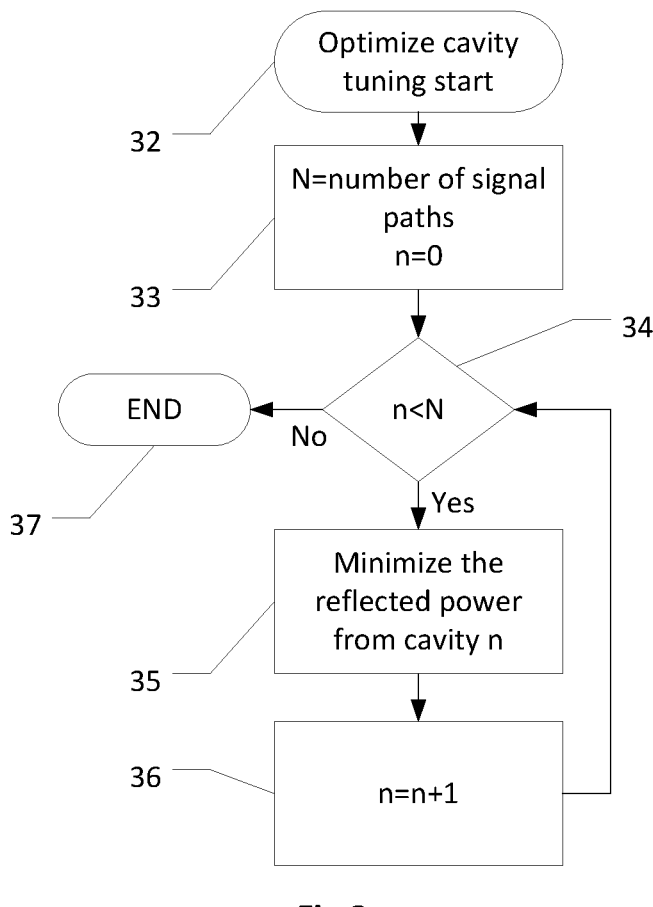
FIG. 8 is a flowchart of the "optimize cavity tuning" sub-process.

FIG. 8 shows the flowchart for the "optimize cavity tuning" sub-process. This optimize cavity tuning sub-process starts at step 32 when invoked by step 19 of the main tuning algorithm (FIG. 6) or when the controller 9 (FIG. 1) detects that the reflected power from one or more resonant cavities 4 has exceeded a predefined threshold. The number of signal paths is defined as N (N=number of signal paths) and the loop counter n is initialized to the value of zero (n=0) at step 33. For example, the embodiment shown in FIG. 1 has three signal paths such that N=3. Other examples may apply. At step 34, the value of the loop counter n is compared to the number of signal paths N. If the value of the loop counter n is less than the number of signal paths N (i.e. n<N), then the condition "Yes" is true and the process proceeds to step 35. The tuning element of the first resonant cavity 4 (FIG. 1) is adjusted until the RF power reflected by the resonant cavity 4 is minimized at step 35. The loop counter n is incremented at step 36 such that the value of the loop counter n becomes equal to n+1 (i.e. n=n+1). Steps 35 and 36 are repeated for each resonant cavity 4 until all the resonant cavities 4 have been adjusted. At this point execution of step 34 results in the determination that the loop escape condition is met (loop condition "No") and the optimize cavity tuning sub-process ends at step 37.

Figure 9:
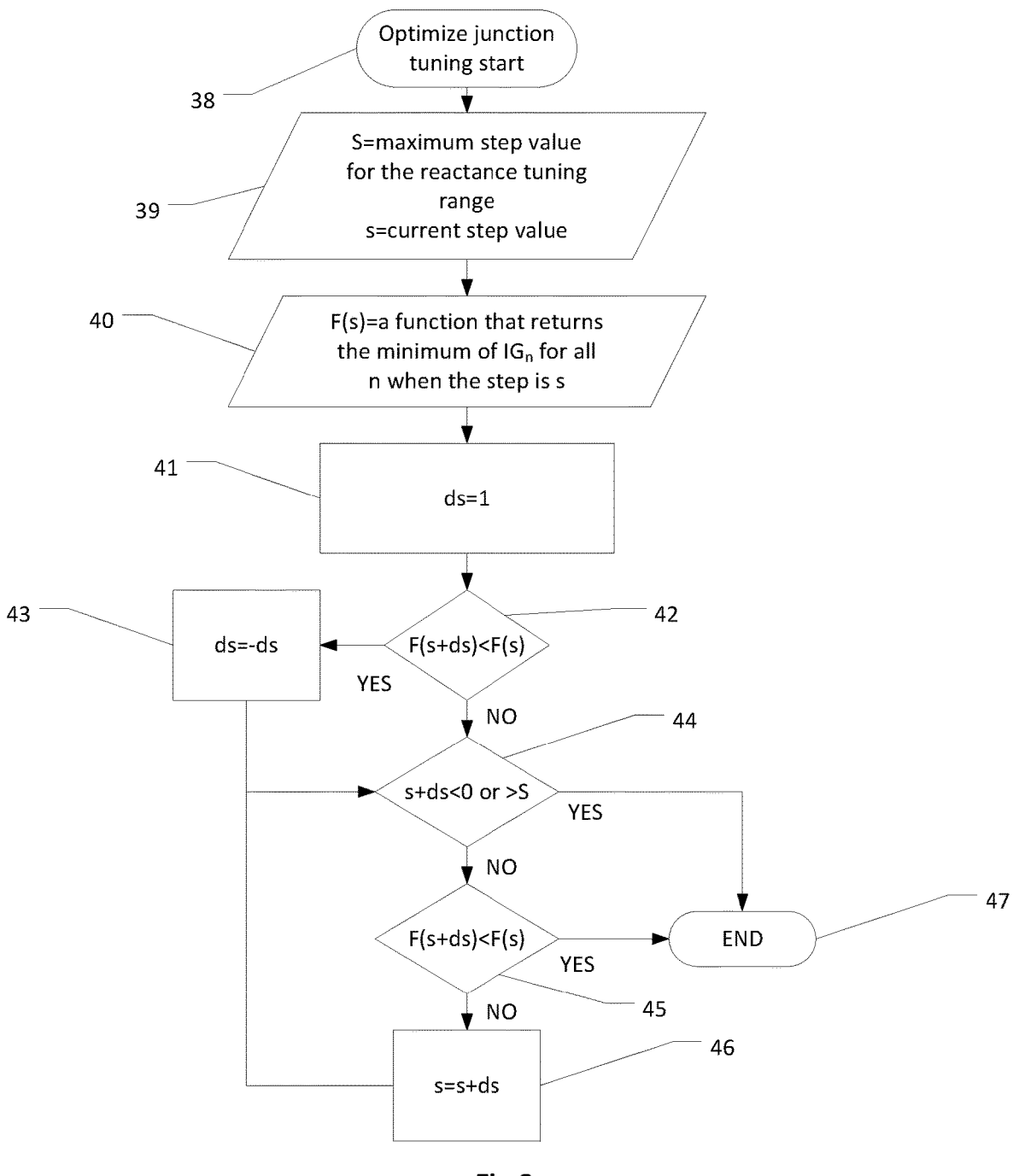
FIG. 9 is a flowchart of the "optimize junction tuning" sub-process.

FIG. 9 is a flowchart of the "optimize junction tuning" sub-process. This optimize junction tuning sub-process maximizes the function F(s), where F(s) returns the minimum value of the set $\{IG_n\}$ where the values (insertion gain of signal path n) $IG_n$ are determined when the tuning position of the reactive element 7 (FIG. 1) in the junction 6 (FIG. 1) is set to a value of s. This optimize junction tuning sub-process starts at step 38 when invoked by step 20 of the main tuning algorithm of FIG. 6. The maximum limit for the step value, S, and the current step value s is defined at step 39. A current value for F(s) is determined at step 40. An increment value ds=1 is determined for the reactance at step 41. At step 42, s is increased by ds so that the new value of F(s+ds) is determined and compared to F(s) (e.g. previously determined at step 40). If this new value of F(s+ds) is lower than the first value F(s) as determined at step 42, then the condition determined at step 42 is the condition "Yes" and the sign of ds is changed at step 43 by implementing ds=−ds. ds is added to s (i.e. s=s+ds) at each execution of step 46, and F(s) is determined for each value. This process continues as long as F(s) is determined to be increasing at step 45 such that step 45 determines the condition "No" (i.e. F(s+ds)<F(s) is not true) and proceeds to step 46. When an incidence of step 45 is reached where F(s) is decreasing such that step 45 determines a condition "Yes" (i.e. F(s+ds)<F(s) is true), then the iteration stops or ends at step 47. Step 44 is in the optimize junction tuning sub-process to prevent the reactance of the reactive element 7 (FIG. 1) from being set to a value outside the tunable range of the reactive element 7. If the controller 9 (FIG. 1) determines at step 44 that (s+ds) is less than 0 (zero) or is greater than the maximum step value S, such that step 44 determines the condition "Yes", then the process proceeds to end at step 47. If, however, the controller 9 determines at step 44 that (s+ds) is not less than 0 (zero) and is not greater than the maximum step value S, such that step 44 determines the condition "No", then the process continues from step 44 to step 45.

Once the combiner is tuned, the controller 9 (FIG. 1) continues to monitor the signals from the directional couplers 3. If the controller 9 detects a frequency change in one or more of the signal paths, the controller 9 will initiate the tuning process again. If the controller 9 detects reflected power from one of the resonant cavities 4 that exceeds a set threshold without detecting a frequency change in that signal path, the controller 9 will adjust the tuning of that resonant cavity 4 to minimize the reflection.

Interface ports are provided on the controller 9 (FIG. 1) to allow the user to interface with the combiner by either connecting to the controller 9 through a network or the internet or by connecting a computer directly to the controller 9. The user can monitor the various settings of the combiner as well as the signal power levels and frequencies. The user can set alarm conditions that would cause the controller 9 (FIG. 1) to send an alert message if any of the values being monitored by the controller 9 fall outside of a corresponding nominal range.

The self tuning transmitter combiner includes a number of resonant cavity filters 4 (FIG. 1) that correspond to the number of radios 1 to be combined, a corresponding number of isolators 2, directional couplers 3 and fixed electrical length transmission lines, a junction 6 with a tunable reactive element 7, an additional final directional coupler 8 at the output of the combiner, a control circuit to monitor and control the combiner, software that optimizes the tuning of the resonant cavity filters 4 and the reactive element 7 of the junction 6, and a graphical user interface (GUI) that is not shown allows the operator to interface with the combiner.

The isolators 2 (FIG. 1) prevent the RF (Radio Frequency) power directed into the combiner from being reflected back into the radios 1. The directional couplers 3 between the isolators 2 and the resonant cavities 4 may direct a small portion of the RF power transmitted into the resonant cavities 4 and reflected from the resonant cavities 4 into the controller 9. The resonant cavities 4 may be set to resonate at the frequency that corresponds to the corresponding signal path, facilitating the transmission of that frequency along the path while inhibiting the transmission of other frequencies. The transmission lines joining the resonant cavities 4 to the junction block 6, in concert with the reactive element 7 in the junction block 6, may transform the impedances of the resonant cavities 4 to maximize the throughput of the RF power through the junction block 6. The junction block 6 may provide multiple inputs for the transmission lines and a single output while acting as a housing for the tunable reactive element 7 as shown in FIG. 1. The tunable reactive element 7 may be set to maximize the RF power throughput while minimizing reflections at the junction 6. The final directional coupler 8 at the combiner output directs a small portion of the RF power leaving the junction block 6 and reflected from the upstream circuit elements that are external to the combiner such as the load 10 as shown in FIG. 1.

The controller 9 may be operable to perform one or more of the following functions:

a. Measure the signals coming from the directional couplers 3, 8 and determine the channel frequency and power level;

b. Tune the resonant cavities 4 and the tunable reactive element 7 to minimize the power reflected from the resonant cavities 4 and to maximize the power output of the combiner;

c. Provide Ethernet connectivity for the combiner; and d. Run the internal software and host the GUI.

The software may be operable to perform one or more of the following functions:

a. Calculate various derived parameters for the RF signal paths such as return loss/VSWR and insertion loss; and b. Optimize the tuning of the resonant cavities 4 and the reactive element 7.

Figure 10:
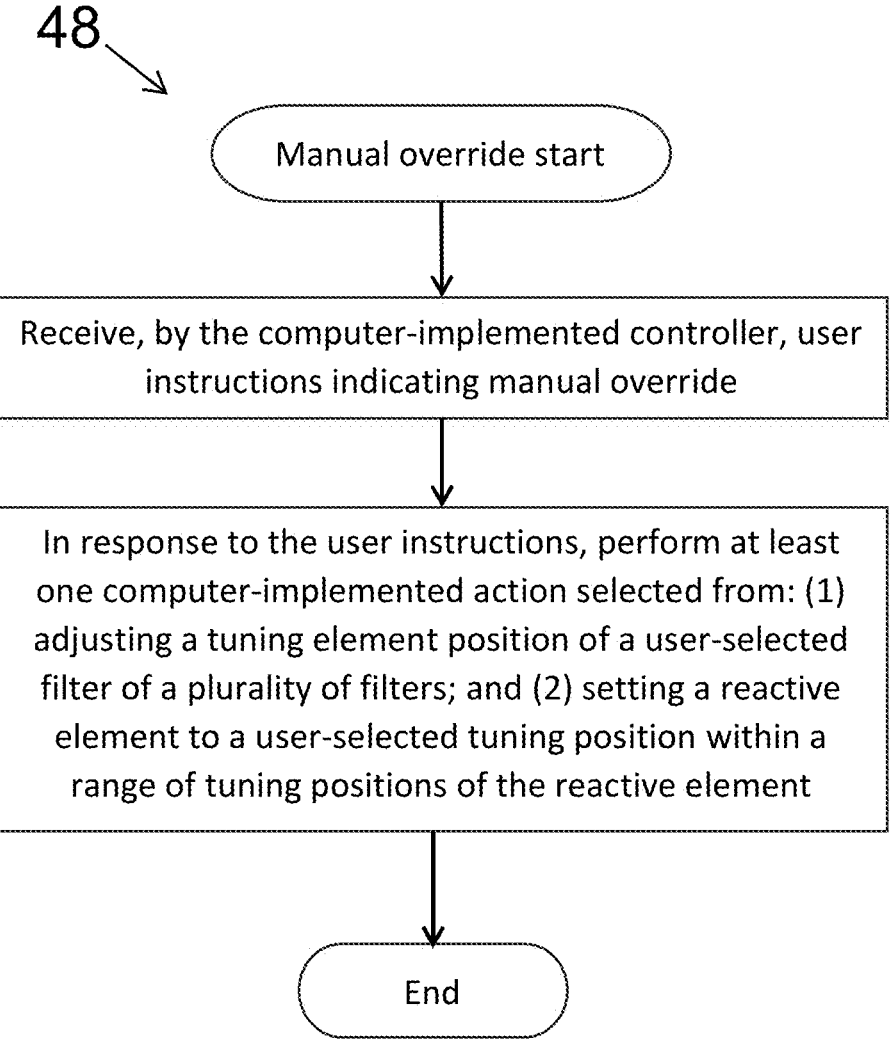
FIG. 10 is a flowchart of the "manual override" sub-process.

The GUI may be operable to perform one or more of the following functions:

a. Allow the operator to monitor the combiner operation and the frequencies and power levels of the signals passing through the combiner;

b. Allow the operator to manually override at sub-process 48 (FIG. 10) the tuning of the combiner and adjust the resonant cavities 4 and the reactive element 7 that receive, by the computer implemented controller, user instructions indicating manual override, and in response to the user instruction, perform at least one computer-implemented action selected from: (1) adjusting a tuning element position of a user-selected filter of a plurality of filters; and (2) setting a reactive element to a user-selected tuning position within a range of tuning positions of the reactive element; and c. Allow the operator to set alarms for anomalous conditions and sub-optimal performance.

While embodiments of the invention have been described and illustrated, such embodiments should be considered illustrative of the invention only. The invention may include variants not described or illustrated herein in detail. Thus, the embodiments described and illustrated herein should not be considered to limit the invention as construed in accordance with the accompanying claims.

What is claimed is:

1. A self-tuning transmitter combiner, the combiner comprising:

(a) a junction for combining a plurality of signals transmitted along a plurality of signal paths comprising a plurality of filters, respectively, the junction comprising a reactive element; and (b) a computer-implemented control unit operable to tune the plurality of filters in response to a plurality of carrier frequencies of the plurality of signals, respectively, the control unit being further operable to tune the reactive element in response to a plurality of insertion gains respectively associated with the plurality of signal paths, said plurality of insertion gains comprising a lowest insertion gain, the reactive element being tuned such that said lowest insertion gain is maximized.

2. The combiner of claim 1 wherein the control unit is operable to minimize a plurality of reflected powers of the plurality of filters by adjusting a plurality of tuning element positions associated with the plurality of filters, respectively.

3. The combiner of claim 2 wherein the control unit is operable to determine, in response to a respective said carrier frequency, a corresponding said tuning element position by interpolation among a plurality of known tuning element positions respectively associated with a plurality of known carrier frequencies.

4. The combiner of claim 1 wherein the reactive element has associated therewith a range of tuning positions, wherein the control unit is operable to set the reactive element to a midpoint tuning position of the range of tuning positions, and wherein the control unit is operable to then determine a first said lowest insertion gain.

5. The combiner of claim 4 wherein the control unit is operable to determine a first said plurality of insertion gains associated with the plurality of signal paths respectively extending from a plurality of directional couplers of the combiner, through the plurality of filters, through the junction, and then to an output directional coupler of the combiner, said first plurality of insertion gains comprising said first lowest insertion gain, the control unit being further operable to then select said first lowest insertion gain from said first plurality of insertion gains.

6. The combiner of claim 5 wherein the control unit is operable to:

(c) set the reactive element to a new tuning position of the reactive element, within the range of tuning positions, that is offset by a predetermined amount from a preceding tuning position of the range of tuning positions;

(d) determine a new said plurality of insertion gains in response to the new tuning position;

(e) determine a new said lowest insertion gain in response to said new plurality of insertion gains; and (f) iteratively repeat steps (c) to (e) until said new lowest insertion gain is lower than a preceding said lowest insertion gain.

7. A method of tuning a combiner, the method comprising:

(a) by a computer-implemented control unit, tuning a plurality of filters of a plurality of signal paths in response to a plurality of carrier frequencies of a plurality of signals being transmitted along the plurality of signal paths, respectively; and (b) by the computer-implemented control unit, tuning a reactive element of a junction for combining the plurality of signals, the reactive element being tuned in response to a plurality of insertion gains respectively associated with the plurality of signal paths, said plurality of insertion gains comprising a lowest insertion gain, the reactive element being tuned such that said lowest insertion gain is maximized.

8. The method of claim 7 wherein step (a) is performed before performing step (b), the method further comprising repeating step (a) after having performed step (b).

9. The method of claim 8 wherein step (a) comprises minimizing a plurality of reflected powers of the plurality of filters by adjusting a plurality of tuning element positions of the plurality of filters, respectively.

10. The method of claim 9 wherein adjusting the plurality of tuning element positions associated with the plurality of filters, respectively, comprises determining, in response to a respective carrier frequency of the plurality of carrier frequencies, a corresponding tuning element position of the plurality of tuning element positions by interpolating among a plurality of known tuning element positions respectively associated with a plurality of known carrier frequencies.

11. The method of claim 10 further comprising repeating the step of respectively minimizing the plurality of reflected powers of the plurality of filters.

12. The method of claim 8 wherein step (b) comprises setting the reactive element to a midpoint tuning position of a range of tuning positions of the reactive element and then determining a first said lowest insertion gain.

13. The method of claim 12 wherein determining said first lowest insertion gain comprises determining a first said plurality of insertion gains associated with the plurality of signal paths extending from a plurality of input directional couplers of the combiner, through the plurality of filters, respectively, through the junction, and then to an output directional coupler of the combiner, said first plurality of insertion gains comprising said first lowest insertion gain, and further comprises selecting said first lowest insertion gain from said first plurality of insertion gains.

14. The method of claim 13 further comprising setting the reactive element to a second tuning position, within the range of tuning positions, that is offset by a predetermined amount from the midpoint tuning position, and then determining a second said plurality of insertion gains associated with the plurality of signal paths, said second plurality of insertion gains comprising a second said lowest insertion gain, and then selecting said second lowest insertion gain from said second plurality of insertion gains.

15. The method of claim 14 further comprising changing the polarity of the predetermined amount if said second lowest insertion gain is lower than said first lowest insertion gain.

16. The method of claim 15 further comprising:

(c) setting the reactive element to a new tuning position, within the range of tuning positions, that is offset by the predetermined amount from a preceding tuning position of the range of tuning positions, the preceding tuning position having associated therewith a preceding said plurality of insertion gains comprising a preceding said lowest insertion gain;

(d) determining a new said plurality of insertion gains in response to the new tuning position, said new plurality of insertion gains comprising a new said lowest insertion gain;

(e) determining said new lowest insertion gain in response to said new plurality of insertion gains; and (f) iteratively repeating steps (c) to (e) until said new lowest insertion gain is lower than said preceding lowest insertion gain.

17. The method of claim 7 further comprising receiving, by the computer-implemented control unit, user instructions indicating manual override and, in response to the user instructions, performing at least one computer-implemented action selected from: (g) adjusting a tuning element position of a user-selected filter of the plurality of filters; and (h) setting the reactive element to a user-selected tuning position within a range of tuning positions of the reactive element.

18. A self-tuning transmitter combiner, the combiner comprising:

(a) means for tuning a plurality of filters of a plurality of signal paths in response to a plurality of carrier frequencies of a plurality of signals being transmitted along the plurality of signal paths, respectively; and (b) means for tuning a reactive element of a junction for combining the plurality of signals, the reactive element being tuned in response to a plurality of insertion gains respectively associated with the plurality of signal paths, said plurality of insertion gains comprising a lowest insertion gain, the reactive element being tuned such that said lowest insertion gain is maximized.

* * * * *